United States Patent
Ripley et al.

(10) Patent No.: US 8,606,200 B2
(45) Date of Patent: Dec. 10, 2013

(54) ERROR VECTOR MAGNITUDE CONTROL WITHIN A LINEAR TRANSMITTER

(75) Inventors: David S. Ripley, Cedar Rapids, IA (US); Edward J. Anthony, Marion, IA (US); James P. Young, Cedar Rapids, IA (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 12/595,588

(22) PCT Filed: Jun. 26, 2008

(86) PCT No.: PCT/US2008/068301
§ 371 (c)(1),
(2), (4) Date: Oct. 12, 2009

(87) PCT Pub. No.: WO2009/003087
PCT Pub. Date: Dec. 31, 2008

(65) Prior Publication Data
US 2010/0197365 A1    Aug. 5, 2010

Related U.S. Application Data

(60) Provisional application No. 60/946,296, filed on Jun. 26, 2007.

(51) Int. Cl.
*H01Q 11/12*    (2006.01)
*H04B 1/04*    (2006.01)

(52) U.S. Cl.
USPC ............... 455/127.1; 455/126; 455/115.1

(58) Field of Classification Search
USPC ................. 455/115.1–115.4, 126–127.5
See application file for complete search history.

(56) References Cited

U.S. PATENT DOCUMENTS

| | | | | |
|---|---|---|---|---|
| 3,891,926 A | * | 6/1975 | Ishman et al. | 455/108 |
| 3,919,643 A | * | 11/1975 | Templin | 455/115.1 |
| 4,165,493 A | * | 8/1979 | Harrington | 330/207 P |
| 4,262,246 A | * | 4/1981 | Fujii | 324/646 |
| 4,422,047 A | * | 12/1983 | Wright | 330/51 |
| 4,547,746 A | * | 10/1985 | Erickson et al. | 330/298 |
| 5,038,112 A | * | 8/1991 | O'Neill | 330/207 P |
| 5,408,690 A | * | 4/1995 | Ishikawa et al. | 455/115.4 |
| 5,542,096 A | * | 7/1996 | Cygan et al. | 455/115.2 |
| 5,564,086 A | * | 10/1996 | Cygan et al. | 455/126 |
| 5,913,154 A | * | 6/1999 | Wynn | 455/127.2 |
| 6,023,612 A | * | 2/2000 | Harris et al. | 455/127.1 |
| 6,091,941 A | * | 7/2000 | Moriyama et al. | 455/126 |
| 6,212,431 B1 | * | 4/2001 | Hahn et al. | 607/61 |

(Continued)

OTHER PUBLICATIONS

A.V. Bezooooijen et al., "Adaptive Methods to Preserve Power Amplifier Linearity Under Antenna Mismatch Conditiona," IEEE Transactions on Circuits and Systems I: Regular Papers, vol. 52, No. 10, Oct. 2005, pp. 2101-2108.

(Continued)

*Primary Examiner* — Edward Urban
*Assistant Examiner* — Rui Hu
(74) *Attorney, Agent, or Firm* — Forefront IP Lawgroup, PLLC

(57) ABSTRACT

In a portable radio transceiver, such as a mobile wireless telephone, conditions indicative of transmitter distortion (as represented by error vector magnitude (EVM)) are sensed, and transmitted RF power is adjusted in response, so as to reduce distortion and decrease EVM. The conditions can include high VSWR or a combination of high VSWR and low battery power.

15 Claims, 6 Drawing Sheets

(56) References Cited

U.S. PATENT DOCUMENTS

| | | | |
|---|---|---|---|
| 6,362,690 B1* | 3/2002 | Tichauer | 330/298 |
| 6,414,562 B1* | 7/2002 | Bouisse et al. | 333/32 |
| 6,600,307 B2* | 7/2003 | Geller et al. | 324/95 |
| 6,625,428 B1* | 9/2003 | Finnell et al. | 455/115.1 |
| 6,895,225 B1* | 5/2005 | Talvitie et al. | 455/78 |
| 6,917,790 B1* | 7/2005 | Braun et al. | 455/101 |
| 7,071,776 B2* | 7/2006 | Forrester et al. | 330/129 |
| 7,088,967 B2* | 8/2006 | Hildebrand et al. | 455/126 |
| 7,103,328 B2* | 9/2006 | Zelley | 455/115.3 |
| 7,151,382 B1* | 12/2006 | Kean et al. | 324/683 |
| 7,209,718 B2* | 4/2007 | Lindell | 455/126 |
| 7,512,386 B2* | 3/2009 | Kalajo et al. | 455/127.1 |
| 7,671,693 B2* | 3/2010 | Brobston et al. | 333/17.3 |
| 7,977,947 B1* | 7/2011 | Jones et al. | 324/522 |
| 8,014,736 B2* | 9/2011 | Yokoyama et al. | 455/126 |
| 8,331,882 B1* | 12/2012 | McCune et al. | 455/127.1 |
| 2002/0094791 A1* | 7/2002 | Pehlke et al. | 455/115 |
| 2004/0121742 A1* | 6/2004 | Abrams et al. | 455/115.1 |
| 2005/0059362 A1* | 3/2005 | Kalajo et al. | 455/127.1 |
| 2005/0208907 A1* | 9/2005 | Yamazaki et al. | 455/126 |
| 2005/0227640 A1* | 10/2005 | Haque et al. | 455/126 |
| 2005/0227646 A1* | 10/2005 | Yamazaki et al. | 455/127.3 |
| 2006/0160501 A1* | 7/2006 | Mendolia et al. | 455/125 |
| 2006/0280261 A1* | 12/2006 | Prikhodko et al. | 375/297 |
| 2007/0026838 A1* | 2/2007 | Staudinger et al. | 455/341 |
| 2007/0054635 A1* | 3/2007 | Black et al. | 455/127.1 |
| 2007/0149146 A1* | 6/2007 | Hwang et al. | 455/80 |
| 2008/0026710 A1* | 1/2008 | Buckley | 455/127.5 |
| 2008/0139146 A1* | 6/2008 | Behzad | 455/127.2 |
| 2010/0173597 A1* | 7/2010 | Behzad | 455/127.1 |

OTHER PUBLICATIONS

W. Koenig et al., "Implementation of a Multiband Frontend for a Medium Range Basestation with the RMS Project: Test and Measurement Results," Proceedings of the SDR 04 Technical Conference and Product Exposition, 2004 SDR Forum.

* cited by examiner

ERROR VECTOR MAGNITUDE CONTROL WITHIN A LINEAR TRANSMITTER

BACKGROUND

Radio frequency (RF) transmitters of the type used in mobile wireless telephones (also known as cellular telephones) and other portable radio transceivers commonly include transmit power control circuitry that adjusts the power of the transmitted RF signal. The power control circuitry can adjust a linear power amplifier to increase or decrease the transmitted RF power in response to operating conditions. For example, in some instances it may be desirable to maintain a constant transmitted RF power despite changes in operating conditions, such as power supply voltage, temperature and RF load. In other instances it may be desirable to maintain transmitted RF power as low as possible and boost it only when necessary to maintain adequate performance.

It is known that power supply fluctuations can hamper power control. The power supply circuitry in a portable radio transceiver is typically battery-based. Like any battery-powered device, operation of the mobile telephone or other such portable radio transceiver gradually discharges or drains the battery. As battery power decreases, the transmitter's ability to properly transmit a signal at the requisite RF power level diminishes. More specifically, if the power control circuitry requires high transmission power at a time when battery power is low, the power amplifier can undesirably distort the transmitted signal. Such distortion is typically measured as error vector magnitude (EVM).

To minimize the above-referenced distortion and thus improve EVM, circuitry has been employed that causes the transmit power control circuitry to adjust the power amplifier to decrease transmitted RF power in response to a decrease in battery power. Although the resulting transmitted RF power may be lower than the power control circuitry would otherwise dictate for the operating conditions, transmitted signal distortion can be reduced. It is generally believed preferable to transmit a lower-power RF signal having minimal distortion than a higher-power RF signal having more distortion.

SUMMARY

In a portable radio transceiver, such as a mobile wireless telephone, conditions indicative of transmitted RF signal distortion are sensed, and transmitted RF power is adjusted in response, so as to inhibit distortion and thus minimize EVM. The conditions can include high voltage standing wave ratio (VSWR) or a similar quantity representing RF loading.

In exemplary embodiments, the present invention adjusts the power amplifier of a portable radio transceiver to decrease transmitted RF power in response to changes in sensed RF loading or, alternatively, in response to changes in a combination of RF loading and battery power. For example, transmitted RF power can be decreased or backed off in response to changes in VSWR or, alternatively, in response to changes in a combination of VSWR and battery power. For example, the transmitted RF power can be decreased in response to VSWR only under conditions in which remaining battery power has dropped below a predetermined threshold. In other embodiments, more complex algorithms that combine VSWR and battery power as inputs can be utilized. The changes in VSWR can comprise changes in VSWR magnitude, VSWR phase, or a combination thereof.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
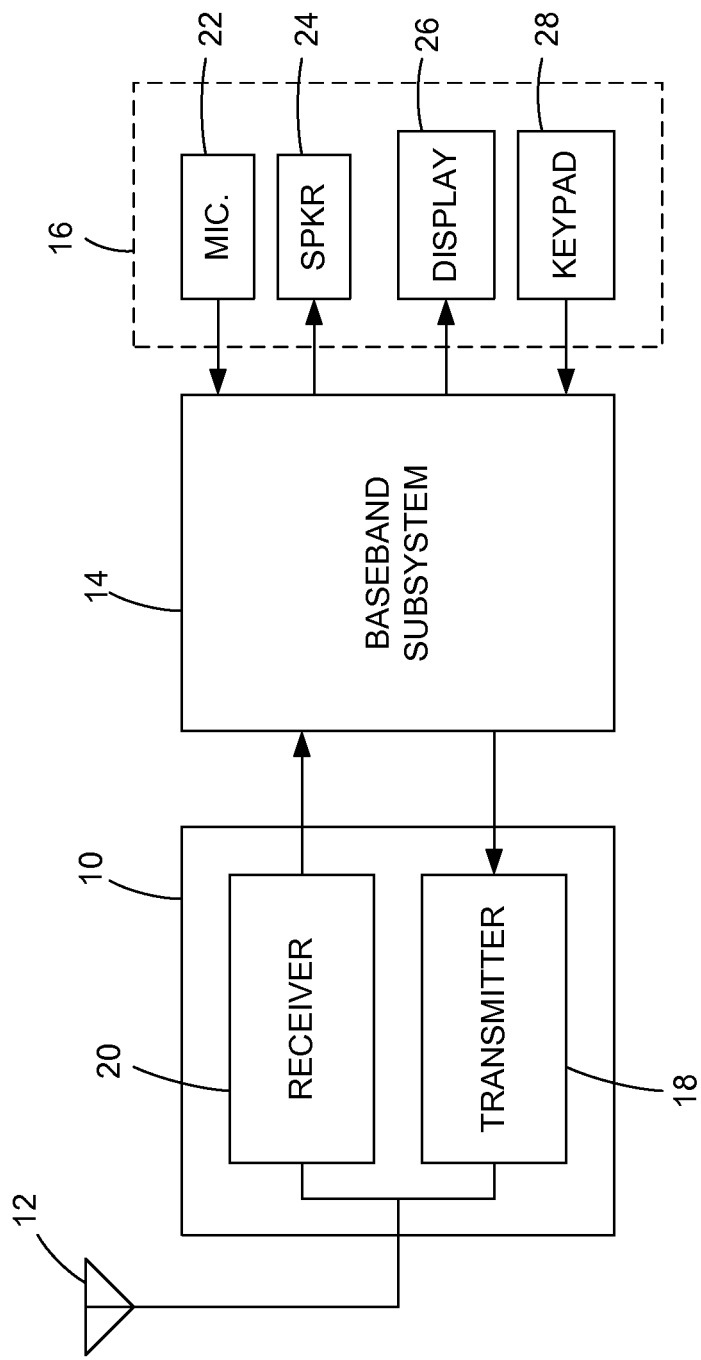
FIG. 1 is a block diagram of a mobile wireless telephone, in accordance with an exemplary embodiment of the present invention.

As illustrated in FIG. 1, in accordance with an exemplary embodiment of the invention, a mobile wireless telephone (also known as a cellular telephone) includes a radio frequency (RF) subsystem 10, an antenna 12, a baseband subsystem 14, and a user interface section 16. The RF subsystem 10 includes a transmitter portion 18 and a receiver portion 20. User interface section 16 includes a microphone 22, a speaker 24, a display 26, and a keyboard 28, all coupled to baseband subsystem 14. But for transmitter portion 18 and, in some embodiments of the invention, portions of baseband subsystem 14, which are described below in further detail, the above-listed elements can be of the types conventionally included in such mobile wireless telephones. As conventional elements, they are well understood by persons of ordinary skill in the art to which the present invention relates and, accordingly, not described in further detail in this patent specification ("herein"). However, unlike conventional transmitter portions of such mobile wireless telephones, transmitter portion 18 includes a power control system and method that, in accordance with the present invention, adjusts transmitted RF power in response to RF loading or, alternatively, in response to a combination of RF loading and transceiver power supply output. It should be noted that while the invention is described in the context of a mobile wireless telephone, the invention is applicable to other devices that comprise mobile or portable RF transceivers.

Figure 2:
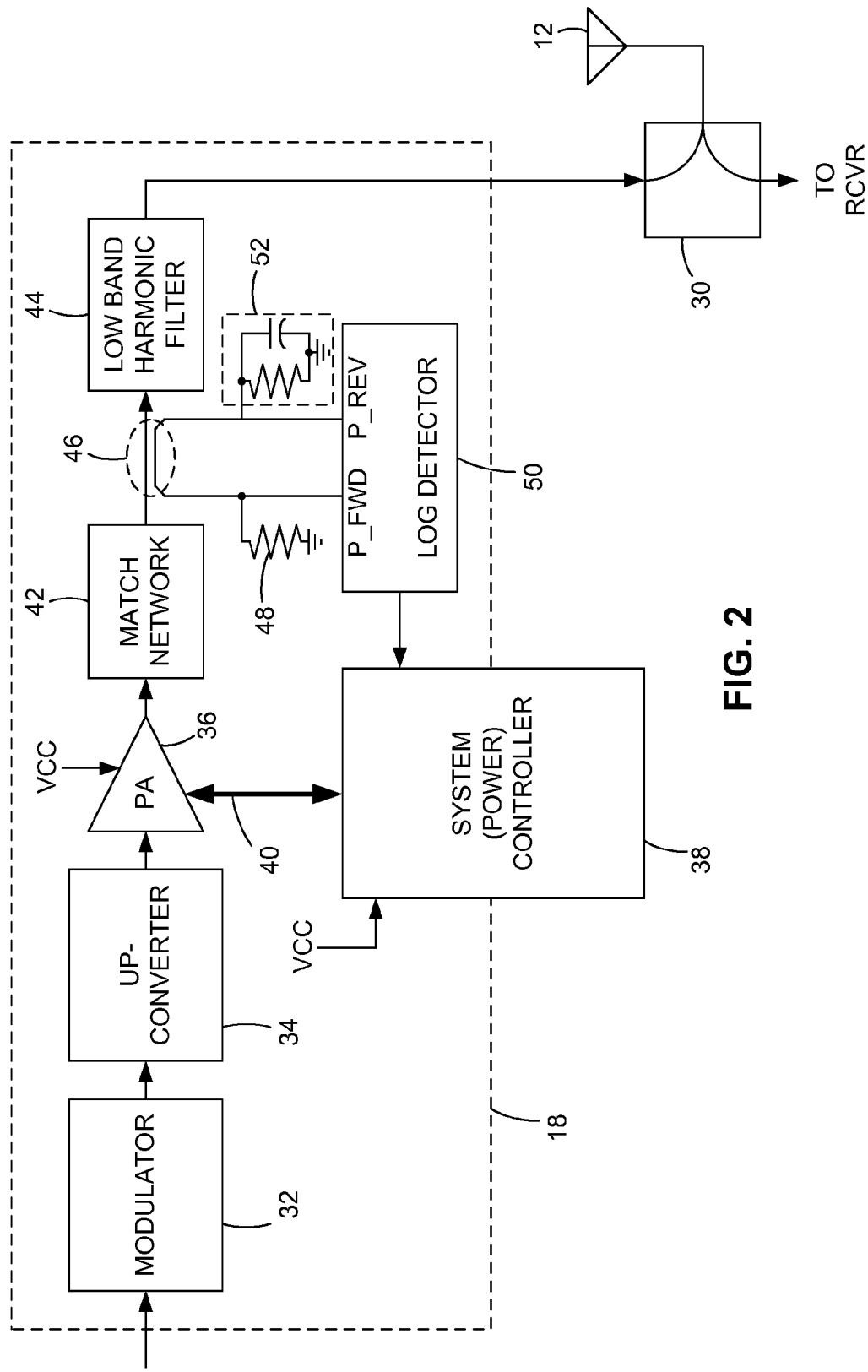
FIG. 2 is a block diagram of the transmitter portion of the mobile wireless telephone of FIG. 1.

As illustrated in FIG. 2, the output of transmitter portion 18 is coupled to antenna 12 (FIG. 1) via a duplexer 30 that allows simultaneous passage of both the transmitted RF signal produced by transmitter portion 18 and the received RF signal that is provided to receiver portion 20 (FIG. 1) or through a switched path for half duplex and time-division multiplexing (TDM) applications. A modulator 32 in transmitter portion 18 receives the signal that is input to transmitter portion 18. Modulator 32 modulates the input signal and provides the modulated signal to an upconverter 34. Upconverter 34 shifts or upconverts the frequency of the modulated signal from a baseband frequency to a transmit frequency and provides the upconverted signal to a power amplifier 36. Power amplifier 36 also receives a signal from the system controller 38 that represents a gain factor and amplifies the upconverted signal in accordance with the gain factor.

As described below, power amplifier 36 is controlled in response to RF loading or, alternatively a combination of RF loading and power supply output (voltage). In the exemplary embodiment, power amplifier 36 is preferably a multi-function module or circuit that includes not only the amplifier circuitry itself but also serial bus interface circuitry and digital-to-analog conversion circuitry (not individually shown in FIG. 2 for purposes of clarity). Such power amplifier modules are well known in the art and therefore not described in further detail herein. Accordingly, as power amplifier 36 is coupled to the power supply voltage (VCC), power amplifier 36 can sample the power supply voltage through its analog-to-digital conversion circuitry and provide a measurement of the power supply voltage to system controller 38 via a serial bus 40. System controller 38 can also transmit the gain factor to power amplifier 36 via serial bus 40.

System controller 38 can similarly include digital-to-analog conversion circuitry that allows it to sample the power supply voltage. Thus, while in some embodiments of the invention it is power amplifier 36 that samples the power supply voltage and forwards the measurement to system controller 38, in other embodiments it is system controller 38 that directly samples the power supply voltage.

System controller 38 comprises the circuitry that controls power amplifier 36. However, system controller 38 can be part of another, more general-purpose element, in which the circuitry that controls power amplifier 36 in accordance with the present invention constitutes only a portion of the circuitry of that element. System controller 38 is shown in FIG. 2 for purposes of illustration as having some of its circuitry or functionality included in transmitter portion 18 and some of its circuitry or functionality included in another element, such as baseband subsystem 14 (FIG. 1). This depiction reflects that in the exemplary embodiment of the invention, some of the circuitry that is involved in controlling power amplifier 36 can be included in transmitter portion 18, while the remainder of the circuitry that is involved in controlling power amplifier 36 can be included in baseband subsystem 14. Conventional mobile wireless telephone architectures commonly include a baseband subsystem having an intelligent or computer-like system controller that controls various telephone functions, including user interface functions, RF subsystem functions (including transmit power control), and other functions. Therefore, in some embodiments the baseband subsystem's system controller can be further programmed or configured to include some or all of the circuitry or functionality that effects the power control methods of the present invention (i.e., in addition to being programmed or configured to effect other, conventional power control methods). In other embodiments, such circuitry or functionality can be included entirely within transmitter 18 or any other suitable element.

The amplified signal that is output by power amplifier 36 is provided to a match network 42 that matches antenna impedance to power amplifier impedance, as known in the art. The output of match network 42 is provided to a low-band harmonic filter 44 that attenuates undesirable harmonics in the signal. The signal filtered by filter 44 is output from transmitter portion 18 and provided to duplexer 30 as described above.

A coupler 46 is connected to the RF signal that match network 42 provides to filter 44 and obtains signals representing the power of that RF signal in forward and reverse directions with respect to the direction of the transmitted RF signal. The forward power signal (P_FWD) is terminated with a resistor 48 and provided to a logarithmic detector 50. The reverse power signal (P_REV) is terminated with a resistor-capacitor (RC) circuit 52 and similarly provided to logarithmic detector 50.

Figure 3:
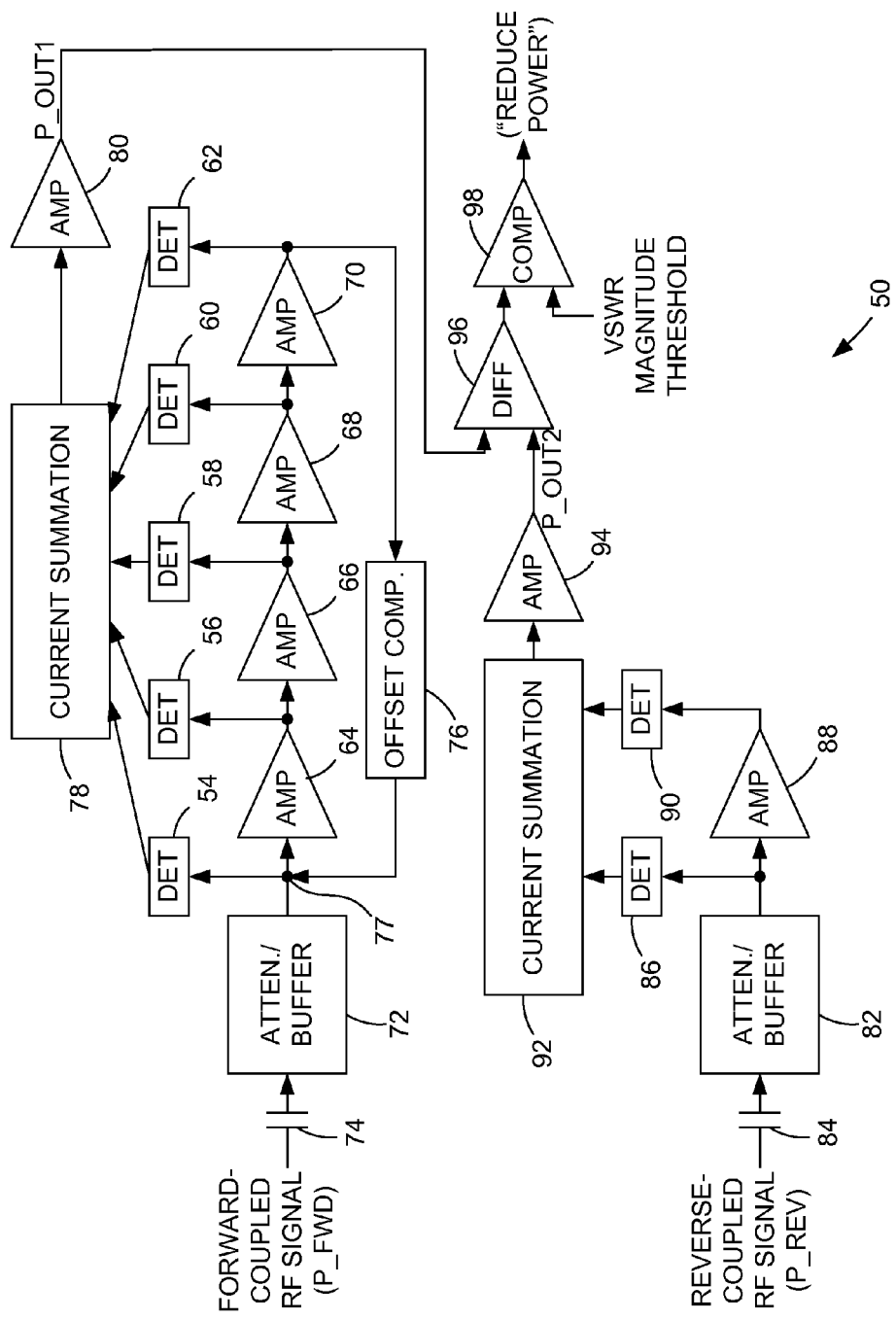
FIG. 3 is a block diagram of the logarithmic detector portion of the transmitter of FIG. 2, in accordance with one exemplary embodiment of the invention.

As known in the art, a logarithmic detector can comprise a cascaded arrangement of linear detectors. As illustrated in FIG. 3, in one exemplary embodiment of the present invention, five peak voltage detectors 54, 56, 58, 60 and 62 are arranged in a chain or cascade, with four limiting amplifiers 64, 66, 68 and 70 disposed between successive detector stages. An attenuator/buffer 72 receives the forward-coupled power signal (P_FWD) via a coupling capacitor 74 and provides it to the inputs of detector 54 and amplifier 64 at the beginning of the cascade arrangement. The output of the last amplifier 70 in the cascade is provided to an offset compensator 76, which provides low frequency feedback around the RF amplifying chain to cancel the large DC offsets which can be present in the gain stage circuitry. This feedback adds a compensation signal to the node 77 at the inputs to the first detector 54 and amplifier 64 in the cascade. Each of peak voltage detectors 54, 56, 58, 60 and 62 outputs a current that is directly proportional to the peak RF voltage within the dynamic range of the limiting RF amplifier. A current summation circuit 78 sums the currents output by peak voltage detectors 54, 56, 58, 60 and 62 and provides the sum to an amplifier 80. The output of amplifier 80 is a signal (P_OUT1) representing the detected RF transmit signal output power in the forward direction.

The above-described cascade arrangement can have any suitable number of stages and is not limited to the four-stage arrangement described above. The various amplifiers can have any suitable gain factors. Persons skilled in the art to which the invention relates will readily be capable of determining a suitable number of stages and suitable gain factors. In general, as such persons understand, the P_OUT1 signal increases approximately linearly as the RF transmit signal output power increases. However, the greater the gain of each amplifier stage in the cascade, the more non-linearity that is introduced. Such non-linearity can be offset by including a greater number of amplifier stages. Thus, persons skilled in the art can consider the tradeoff between number of stages and the gain of each stage and select a combination that is believed to be suitable, such as the four amplifier stages illustrated in FIG. 3, each having, for example, 12 decibels (dB) of gain. In such an embodiment, amplifier 80 can amplify its input by, for example, a factor of 1.67 to scale the response slope of the detector output.

The reverse-coupled power signal (P_REV) is processed similarly. Distortion in the power amplifier is most common at the highest output levels. The reverse detector is simplified by eliminating several of the RF gain stages and detectors such that it outputs a detected response only at the high signal levels. As further illustrated in FIG. 3, an attenuator/buffer 82 receives the reverse-coupled power signal (P_REV) via a coupling capacitor 84 and provides it to the inputs of a peak voltage detector 86 and amplifier 88. The output of amplifier 88 is provided to the input of another peak voltage detector 90. Each of peak voltage detectors 86 and 90 outputs a current that is directly proportional to the peak RF voltage within the dynamic range of the limiting RF amplifier. A current summation circuit 92 sums the currents output by peak voltage detectors 86 and 90 and provides the sum to an amplifier 94.

The output of amplifier 94 is a signal (P_OUT2) representing the detected RF transmit signal output power in the reverse direction.

A difference circuit 96 produces a signal representing the difference between P_OUT1 and P_OUT2. The signal produced by difference circuit 96 thus represents the magnitude of the voltage standing wave ratio (VSWR). A comparator 98 compares this VSWR magnitude signal with a predetermined threshold signal, representing a VSWR magnitude threshold level at which it is believed useful to decrease or back off the transmitted RF power. Thus, if the magnitude of the VSWR signal rises above the predetermined threshold, comparator 98 outputs a signal to system controller 38 (FIG. 2) to which system controller 38 responds by decreasing the gain signal that it provides to power amplifier 36. Power amplifier 36 responds to a decrease in the gain signal by decreasing the transmitted RF power. Decreasing transmitted RF power under such circumstances can reduce distortion (of which error vector magnitude (EVM) is a measure).

Figure 4:
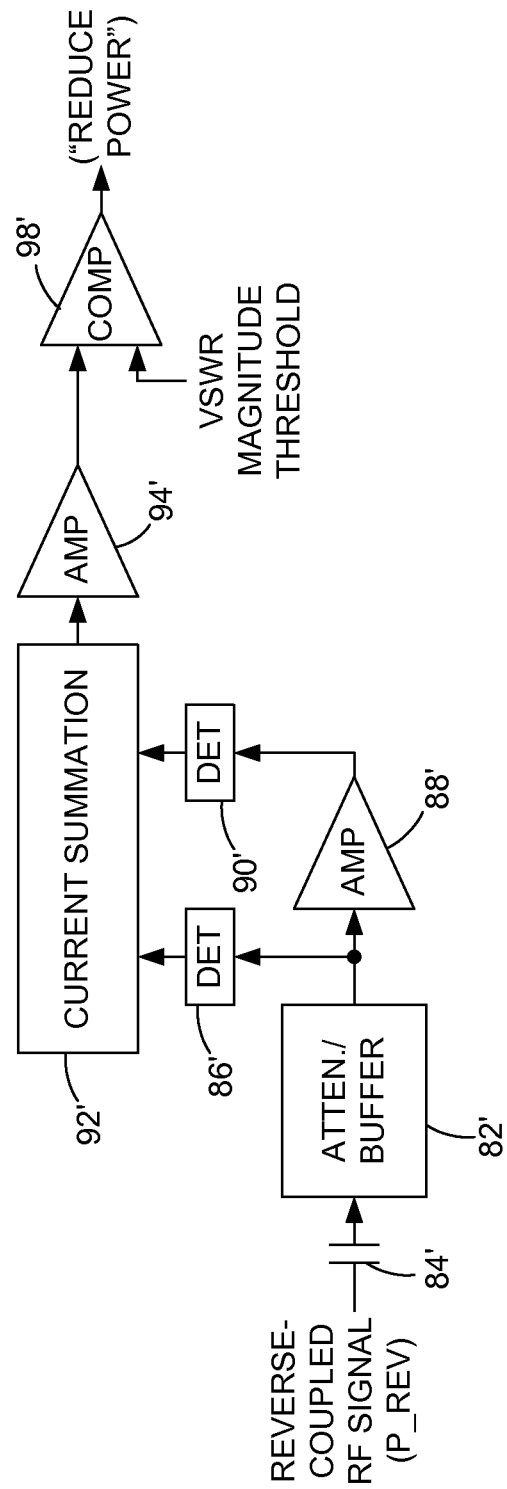
FIG. 4 is a block diagram similar to FIG. 3, in accordance with another exemplary embodiment of the invention

As illustrated in FIG. 4, in an alternative embodiment, the output of a reverse detector identical to that described above with regard to FIG. 3 can be directly compared against a predetermined threshold. Given known characteristics of the coupler within the design, the threshold can be tailored such that the reverse detection would exceed the threshold only at high output power levels under high VSWR.

In the embodiments described above with regard to FIGS. 2, 3 and 4, transmitted RF power is decreased in response to a change in VSWR magnitude. In another embodiment, described below with regard to FIG. 5, transmitted RF power is decreased in response to a combination of a change in VSWR magnitude and a change in VSWR phase. The change in VSWR phase can comprise instances in which VSWR phase reaches a predetermined threshold (angle). In such an exemplary embodiment of the present invention, five peak voltage detectors 54', 56', 58', 60' and 62' and four amplifiers 64', 66', 68' and 70' are arranged and operate in the same manner as corresponding elements in the embodiment described above with regard to FIG. 3. Likewise, an attenuator/buffer 72' receives the forward-coupled power signal (P_FWD) via a coupling capacitor 74' and provides it to the inputs of detector 54' and amplifier 64'. An offset compensator 76', current summation circuit 78', and amplifier 80' are also arranged and operate in the same manner as in the above-described embodiment. These elements operate together to process the forward-coupled RF signal in the same manner as in the above-described embodiment.

The reverse-coupled power signal is processed by circuitry similar to that described above with regard to the embodiment illustrated in FIG. 3, but with the addition of circuitry for processing the phase information. Thus, as further illustrated in FIG. 5, an attenuator/buffer 82' receives the reverse-coupled power signal via a coupling capacitor 84' and provides it to the inputs of a peak voltage detector 86' and amplifier 88'. The output of amplifier 88' is provided to the input of another peak voltage detector 90'. A current summation circuit 92' sums the currents output by peak voltage detectors 86' and 88' and provides the sum to an amplifier 94'. A difference circuit 96' produces a signal representing the difference between the forward and reverse power signals, i.e., the VSWR magnitude. A comparator 98' compares this VSWR magnitude signal with a predetermined threshold signal, representing a VSWR magnitude threshold level at which it is believed useful to decrease or back off the transmitted RF power, as in the above-described embodiment.

Unlike the above-described embodiment, this embodiment further includes two limiters 100 and 102, a phase detector 104, and a comparator 106, for processing phase information. Limiter 100 receives the output of amplifier 88' and amplifies the RF waveform to provide consistent zero crossing phase transitions. Similarly, limiter 102 receives the output of amplifier 64' and amplifies the RF waveform to provide consistent zero crossing phase transitions. Phase detector 104 receives the outputs of limiters 100 and 102 and determines the phase difference of the signals. The phase difference thus represents the relative phase of the voltage standing wave ratio (VSWR). Comparator 106 compares this VSWR phase signal with one or more predetermined threshold signals, representing a VSWR phase threshold level or range at which it is believed useful to decrease or back off the transmitted RF power. In the illustrated embodiment, comparator 106 is a windowed comparator, comparing the VSWR phase signal with an upper phase threshold and lower phase threshold (thereby defining a phase range). However, in other embodiments the comparator can be of the single-threshold type.

An AND logic gate 108 receives the outputs of comparators 98' and 106. Thus, in an instance in which the VSWR magnitude signal reaches the predetermined VSWR magnitude threshold, and the VSWR phase signal reaches the predetermined VSWR phase threshold, AND logic gate 108 asserts its output signal. This output signal is provided to system controller 38 (FIG. 2), to which system controller 38 responds by decreasing the gain signal that it provides to power amplifier 36. Power amplifier 36 responds to a decrease in the gain signal by decreasing the transmitted RF power. As noted above, decreasing transmitted RF power under such circumstances can reduce distortion as represented by error vector magnitude (EVM).

Although only the case in which system controller 38 causes transmitted RF power to decrease is described above, it should be understood that system controller 38 also causes the transmitted RF power to return to its previous level or to otherwise increase once the conditions that led system controller 38 to decrease the power no longer exist. For example, in an instance in which system controller 38 has responded to a rise in the magnitude of the VSWR above the predetermined threshold by causing transmitted RF power to decrease, system controller 38 causes transmitted RF power to increase again once the magnitude of the VSWR drops below the predetermined threshold.

Figure 5:
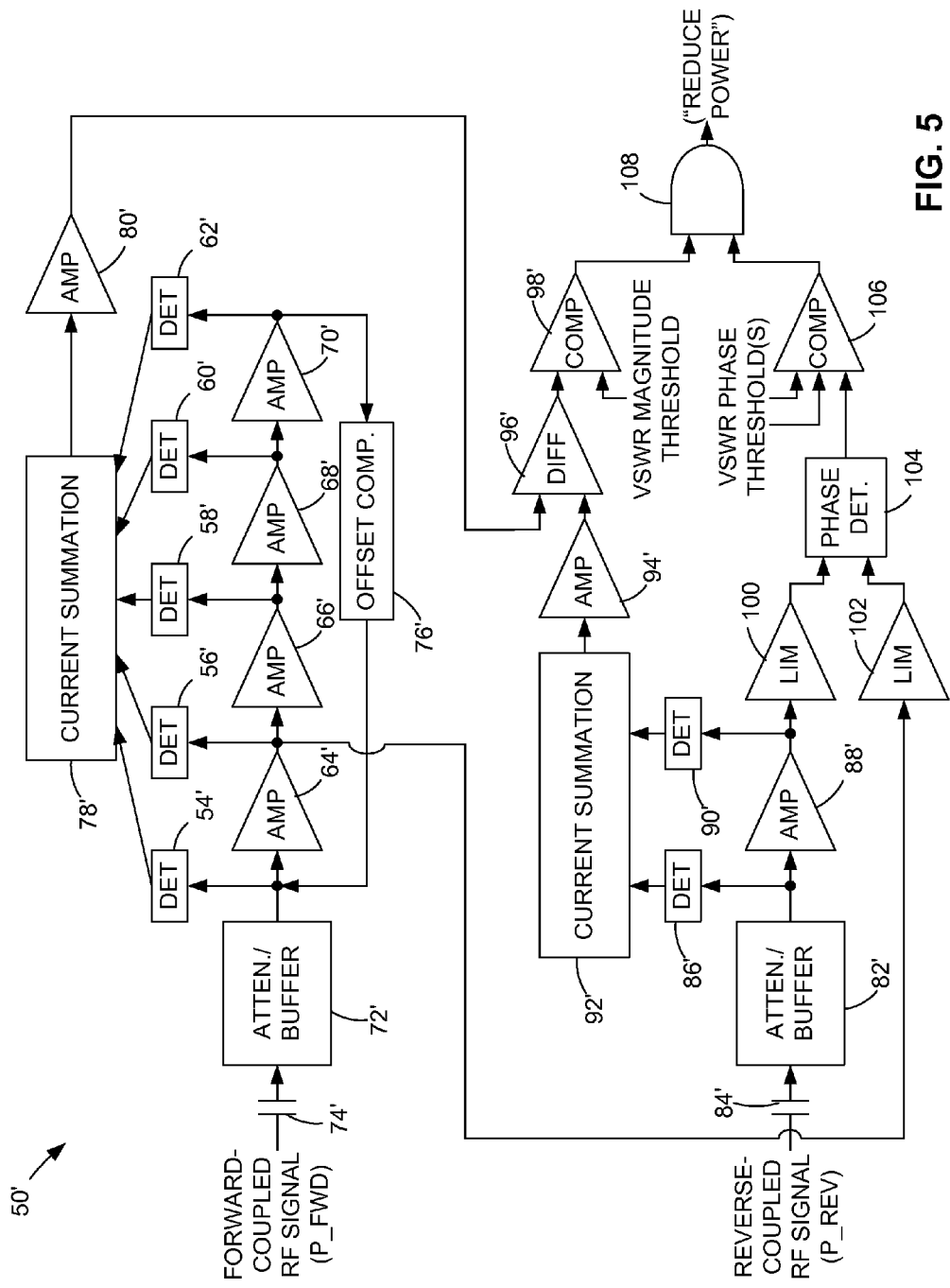
FIG. 5 is a block diagram similar to FIG. 3, in accordance with still another exemplary embodiment of the invention.
Figure 6:
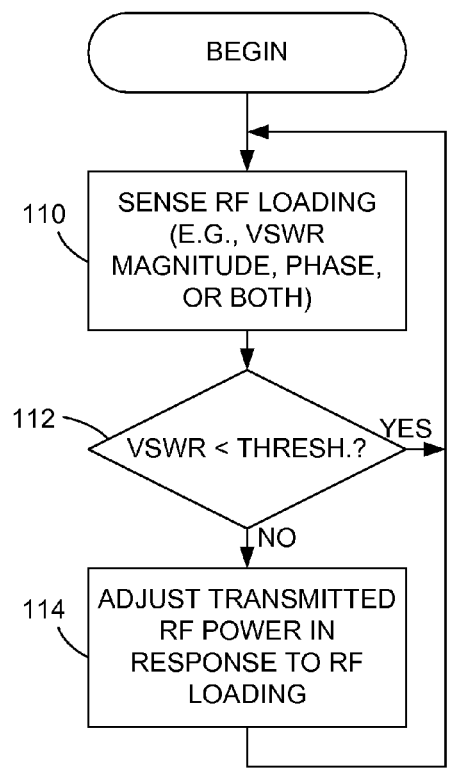
FIG. 6 is a flow diagram, illustrating a transmitter power control method in the transmitter of FIGS. 2 and 3.

An exemplary method of operation of the above-described systems is illustrated by the flow diagram of FIG. 6. As indicated by step 110, transmitter RF loading is sensed, either by sensing VSWR magnitude only (by the logarithmic detector circuitry 50 described above with regard to FIG. 3 or other suitable circuitry) or, alternatively, by sensing both VSWR magnitude and VSWR phase (by the logarithmic detector circuitry 50' described above with regard to FIG. 5 or other suitable circuitry). As indicated by step 112, if the sensed VSWR quantity or quantities are below a predetermined threshold value or values, then no adjustment to transmitted RF power is deemed necessary, and the method returns to step 110. If the sensed VSWR quantity or quantities exceed the predetermined threshold value or values, then the transmitted RF power is decreased, as indicated by step 114. The method then returns to step 110 and continues to operate in this manner so long as the telephone is transmitting.

Figure 7:
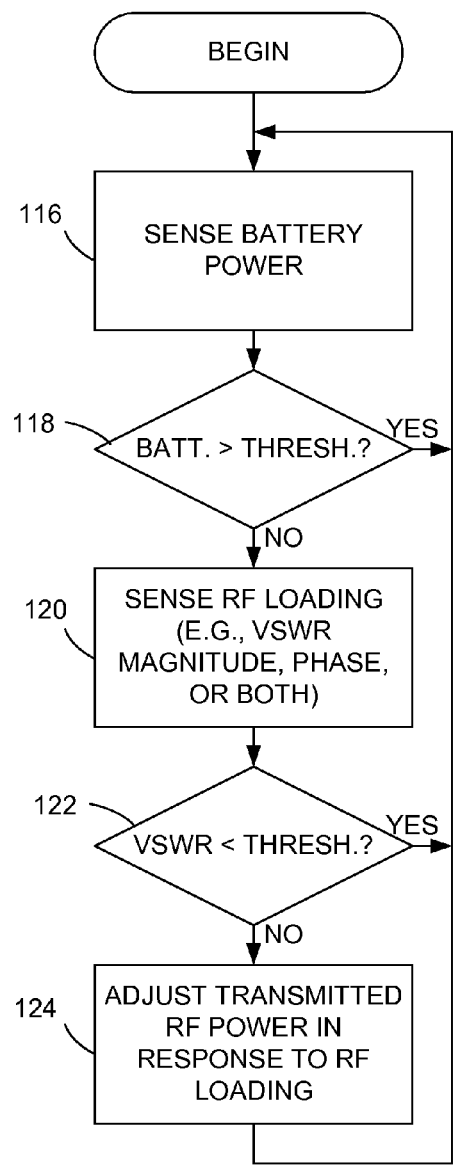
FIG. 7 is a flow diagram similar to FIG. 6, illustrating a transmitter power control method in the transmitter of FIGS. 2 and 4.

Although in the above-described embodiments system controller 38 performs little processing relating to the present invention beyond decreasing the gain signal that it provides to power amplifier 36 directly in response to a change in the detection signal it receives from the circuit of FIG. 3, 4 or 5, in other embodiments the system controller can perform additional processing that incorporates additional information as inputs to a more complex algorithm that determines whether to adjust transmitted RF power. For example, as illustrated by the flow diagram of FIG. 7, the remaining battery power can be included as another input to such an algorithm. As indicated by step 116, the power supply output voltage (VCC) is sensed, either by system controller 38 or, alternatively, by power amplifier 36, which in turn provides the voltage measurement to system controller 38. As indicated by step 118, if the measured power supply output is greater than a predetermined threshold voltage, then no adjustment to transmitted RF power is deemed necessary, and the method returns to step 116. If the measured power supply output voltage is less than the predetermined threshold voltage, then transmitter RF loading (e.g., VSWR magnitude, phase, or both) is sensed, as indicated by step 120, which is the same as step 110 in the embodiment described above with regard to FIG. 6. As indicated by step 122, if the sensed VSWR quantity or quantities are below a predetermined threshold value or values, then no adjustment to transmitted RF power is deemed necessary, and the method returns to step 116. If the sensed VSWR quantity or quantities exceed the predetermined threshold value or values, then the transmitted RF power is adjusted, as indicated by step 124. The method then returns to step 116 and continues to operate in this manner so long as the telephone is transmitting. As noted above, only the steps relating to adjusting transmitted RF power downwardly are shown in FIGS. 5 and 6 for purposes of clarity, but steps in which transmitted RF power is re-adjusted upwardly in response to improved conditions, are also contemplated.

While various embodiments of the invention have been described, it will be apparent to those of ordinary skill in the art that many more embodiments and implementations are possible that are within the scope of this invention. Accordingly, the invention is not to be restricted except in light of the following claims.

What is claimed is:

1. A method for adjusting transmitted radio frequency (RF) signal output power in a portable radio transceiver, comprising:
   sensing a transmitter power supply output voltage;
   comparing the transmitter power supply output voltage to a predetermined threshold voltage;
   sensing a transmitter RF loading only when the transmitter power supply output voltage is less than the predetermined threshold voltage, wherein the sensing of the transmitter RF loading includes sensing of a first voltage standing wave ratio (VSWR) difference in phases of a sampled transmitted RF signal output power in a forward direction and a reverse direction, and sensing of a second VSWR difference in magnitudes of the sampled transmitted RF signal output power in the forward direction and the reverse direction; and
   adjusting the transmitted RF signal output power in response to a change in a combination of the first VSWR difference and the second VSWR difference of the transmitter RF loading.

2. The method claimed in claim 1, wherein the step of adjusting transmitted RF signal output power in response to the change in a combination of the phases and magnitudes of the transmitter RF loading comprises:
   determining if the transmitter power supply output voltage exceeds the predetermined threshold voltage; and
   not adjusting the transmitted RF signal output power if the transmitter power supply output voltage exceeds the predetermined threshold voltage.

3. The method claimed in claim 1, wherein:
   the step of adjusting transmitted RF signal output power in response to a change in the transmitter RF loading comprises adjusting the transmitted RF signal output power in response to a change in the transmitter power supply output voltage and the VSWR.

4. The method claimed in claim 3, wherein:
   the step of sensing the VSWR comprises sensing the VSWR magnitude; and
   the step of adjusting transmitted RF signal output power comprises adjusting the transmitted RF signal output power in response to a change in the VSWR magnitude.

5. The method claimed in claim 4, wherein the adjusting the transmitted RF signal output power is in response to a change in a combination of the transmitter power supply output voltage and the transmitter RF loading.

6. The method claimed in claim 3, wherein:
   the step of sensing VSWR comprises sensing a VSWR phase; and
   the step of adjusting transmitted RF signal output power comprises adjusting transmitted RF signal output power if a change in the VSWR phase is higher than a predetermined threshold.

7. The method claimed in claim 3, wherein:
   the step of sensing VSWR comprises sensing both the VSWR magnitude and the VSWR phase; and
   the step of adjusting transmitted RF signal output power comprises adjusting the transmitted RF signal output power if a change in a combination of VSWR magnitude and VSWR phase exceeds a predetermined threshold.

8. A system for adjusting transmitted radio frequency (RF) signal output power in a portable radio transceiver, comprising:
   a power amplifier that provides the transmitted RF signal output power;
   an RF load detector, the RF load detector sensing voltage standing wave ratio (VSWR) of a sampled transmitted RF signal output power, wherein sensing the VSWR includes sensing of a first VSWR difference in phases of the sampled transmitted RF signal output power in a forward direction and a reverse direction, and sensing of a second VSWR difference in magnitudes of the sampled transmitted RF signal output power in the forward direction and the reverse direction; and a controller configured to:
   sense and compare a transmitter power supply output voltage to a predetermined threshold voltage;
   sensing said VSWR only when the sensed transmitter power supply output voltage is less than the predetermined threshold voltage, wherein the adjustment of the transmitter RF signal output power is in response to a change in a combination of the first VSWR difference and the second VSWR difference.

9. The system claimed in claim 8, wherein:
   the RF load detector senses the VSWR magnitude; and
   the controller adjusts the transmitted RF signal output power in response to a change in the VSWR magnitude that exceeds a predetermined threshold.

10. The system claimed in claim 8, wherein:
    the RF load detector senses the VSWR phase; and
    the controller adjusts the transmitted RF signal output power in response to a change in the VSWR phase that exceeds a predetermined threshold.

11. The system claimed in claim 8, wherein:

the controller determines the transmitter power supply output voltage; and the controller does not adjust the transmitted RF signal output power in response to the transmitter power supply output voltage that is less than the predetermined threshold voltage.

12. The system claimed in claim 8, wherein:

the RF load detector senses both the VSWR magnitude and the VSWR phase; and the controller adjusts the transmitted RF signal output power in response to a change in the combination of the VSWR magnitude and the VSWR phase that exceeds a predetermined threshold.

13. The system claimed in claim 12, wherein:

the controller adjusts the transmitted RF signal output power in response to a change in a combination of the transmitter power supply output voltage, the VSWR magnitude, and the VSWR phase.

14. A portable transceiver comprising:

a power amplifier that provides a transmitted RF signal output power;

a directional coupler that samples the transmitted RF signal output power;

an RF load detector that senses voltage standing wave ratio (VSWR) of the sampled transmitted RF signal output power, wherein sensing the VSWR includes sensing of a first VSWR difference in phases of the sampled transmitted RF signal output power in a forward direction and a reverse direction, and sensing of a second VSWR difference in magnitudes of the sampled transmitted RF signal output power in the forward direction and the reverse direction; and a controller configured to:

sense and compare a transmitter power supply output voltage to a predetermined threshold voltage;

sensing said VSWR only when the sensed transmitter power supply output voltage is less than the predetermined threshold voltage, wherein the adjustment of the transmitted RF signal output power is in response to a change in a combination of the first VSWR difference and the second VSWR difference.

15. The portable transceiver claimed in claim 14, wherein:

the RF load detector senses the VSWR magnitude; and the controller adjusts transmitted RF signal output power in response to a change in the VSWR magnitude that exceeds a predetermined threshold.

* * * * *